United States Patent
Ho et al.

(10) Patent No.: US 10,950,426 B2
(45) Date of Patent: Mar. 16, 2021

(54) DIELECTRIC LAYER, INTERCONNECTION STRUCTURE USING THE SAME, AND MANUFACTURING METHOD THEREOF

(71) Applicant: TAIWAN SEMICONDUCTOR MANUFACTURING CO., LTD., Hsinchu (TW)

(72) Inventors: Yi-Chen Ho, Taichung (TW); You-Hua Chou, Hsinchu (TW); Yen-Hao Liao, New Taipei (TW); Che-Lun Chang, Kaohsiung (TW); Zhen-Cheng Wu, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 141 days.

(21) Appl. No.: 16/103,744

(22) Filed: Aug. 14, 2018

(65) Prior Publication Data

US 2020/0058495 A1    Feb. 20, 2020

(51) Int. Cl.
*H01L 21/02* (2006.01)
*H01L 21/768* (2006.01)
*H01L 21/311* (2006.01)

(52) U.S. Cl.
CPC .... *H01L 21/02203* (2013.01); *H01L 21/0228* (2013.01); *H01L 21/31138* (2013.01); *H01L 21/7682* (2013.01); *H01L 21/02118* (2013.01); *H01L 21/02211* (2013.01); *H01L 21/02274* (2013.01); *H01L 21/02299* (2013.01); *H01L 21/76807* (2013.01); *H01L 21/76835* (2013.01); *H01L 21/76843* (2013.01); *H01L 21/76877* (2013.01)

(58) Field of Classification Search
CPC .......... H01L 21/02203; H01L 21/0228; H01L 21/7682; H01L 21/31138; H01L 21/02299; H01L 21/76877; H01L 21/02118; H01L 21/02274; H01L 21/76835; H01L 21/76807; H01L 21/76843; H01L 21/02211; H01L 21/02348; H01L 21/02126; H01L 21/7624; H01L 21/76832; H01L 2221/1047

See application file for complete search history.

(56) References Cited

U.S. PATENT DOCUMENTS

| | | | |
|---|---|---|---|
| 2008/0038934 A1* | 2/2008 | Vrtis | H01L 21/7682 438/759 |
| 2009/0203201 A1* | 8/2009 | Masuda | H01L 21/76825 438/585 |

(Continued)

OTHER PUBLICATIONS

Guoyong Fang, Lina Xu, Jing Ma, and Aidong Li, Theoretical Understanding of the Reaction Mechanism of SiO2 Atomic Layer Deposition, ASC Publications, Chem. Mater. 2016, 28, 1247-1255 (Year: 2016).*

(Continued)

*Primary Examiner* — Laura M Menz
*Assistant Examiner* — Pavel G Ivanov
(74) *Attorney, Agent, or Firm* — Maschoff Brennan

(57) ABSTRACT

A method for manufacturing a dielectric layer includes forming a first dielectric film over a substrate. A first porogen is deposited over the first dielectric film. A second dielectric film is formed on and in contact with the first dielectric film and the first porogen. The first porogen is removed.

20 Claims, 12 Drawing Sheets

(56) References Cited

U.S. PATENT DOCUMENTS

| | | | | |
|---|---|---|---|---|
| 2012/0152276 A1* | 6/2012 | Pagliaro | ............ | H01L 21/02052 |
| | | | | 134/2 |
| 2013/0032955 A1* | 2/2013 | Liou | ................ | H01L 21/02123 |
| | | | | 257/787 |
| 2014/0002773 A1* | 1/2014 | Hirai | ................ | G02F 1/133528 |
| | | | | 349/76 |
| 2014/0099798 A1* | 4/2014 | Tsuji | .................... | H01L 21/268 |
| | | | | 438/795 |
| 2015/0097288 A1* | 4/2015 | Liou | ................ | H01L 21/76829 |
| | | | | 257/741 |
| 2016/0329242 A1* | 11/2016 | Oszinda | .............. | H01L 21/3105 |
| 2019/0157076 A1* | 5/2019 | Hausmann | .............. | C23C 16/04 |

OTHER PUBLICATIONS

Guo-Yong Fang, Li-Na Xu, Yan-Qiang Cao, Lai-Guo Wang, Di Wu, Ai-Dong Li, Self-catalysis by aminosilanes and strong surface oxidation by O2 plasma in plasma-enhanced atomic layer deposition of high-quality SiO2, The Royal Society of Chemistry, Chem. Commun., 2015, 51, 1341-1344 (Year: 2015).*

* cited by examiner

310

DIELECTRIC LAYER, INTERCONNECTION STRUCTURE USING THE SAME, AND MANUFACTURING METHOD THEREOF

BACKGROUND

The dielectric constant, k, is a value of a material's insulating properties. Low k dielectric materials are becoming increasingly popular in integrated circuits because of the improved electrical performance that can be obtained through the use of low k dielectrics as inter-metal or inter-level insulating material. For instance, the RC time constant of a device or circuit employing low k dielectrics can be substantially reduced over traditional inter-level dielectrics, thus allowing for faster switching speeds and improved device performance.

In modern semiconductor devices, low k dielectric materials are used as inter-level, also known as inter-metal, dielectrics to insulate one metal level from another. As is well known in the art, metal levels are stacked atop one another to form the complete integrated circuit, with the inter-level dielectric films acting as an insulating material there between. In damascene metallization processes, the inter-level dielectric material also acts as a supporting layer in which the metal traces are formed. Integrated circuits having six, eight, and an even greater number of stacked metal layers are known in the art. Trends suggest that the number of stacked metal layers will increase over time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
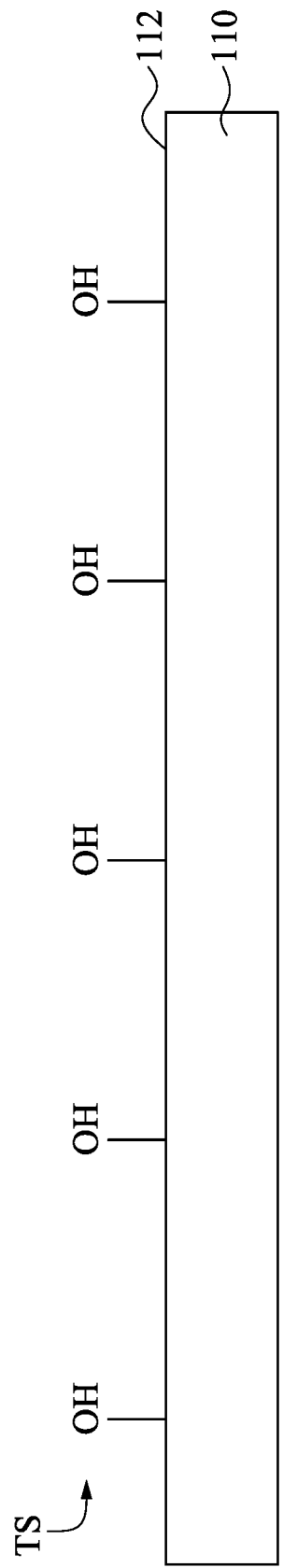
FIGS. 1A to 1H are cross-sectional views of a method for manufacturing a super low-k dielectric layer by performing ALD at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

This disclosure relates to super low dielectric constant (k) dielectric layer fabrication and more specifically to porous super low-k dielectric formation by performing atomic layer deposition (ALD) and removal of porogens. These super low-k dielectric layers may be used for, as an example, IMD or ILD in an integrated circuit. In the semiconductor processing art, as feature sizes continue to decrease with each generation or process node, RC delays and crosstalk associated with conductors or metallization layers have increased. These conductors may be formed in and are surrounded by dielectric materials. By lowering the dielectric constants in these dielectric materials, device performance can be improved.

FIGS. 1A to 1H are cross-sectional views of a method for manufacturing a super low-k dielectric layer by performing ALD at various stages in accordance with some embodiments of the present disclosure. Reference is made to FIG. 1A. A substrate 110 is provided. The substrate 110 can be any structure on which a layer is to be deposited. Specific examples are provided in a given context below. The substrate 110 has a surface 112. The layer that is to be deposited will subsequently be deposited on the surface 112. The surface 112 can include appropriate materials, and may include a dielectric layer, a metal-containing layer, or another. The surface 112 can also include different materials within the surface 112. For example, a first portion of the surface 112 can include a dielectric material, such as a high-k dielectric like a metal oxide dielectric, and a second different portion of the surface 112 can include a metal-containing material, such as TiN, TaN, TiAl, TiAlC, or the like. In another example, the first portion of the surface 112 can be a first metal-containing material, such as TiN, and the second different portion of the surface 112 can be a second metal-containing material, such as TaN.

In some embodiments, the surface 112 of the substrate 110 can be terminated with a terminating species TS. In some examples, the terminating species TS is hydroxide (—OH), oxygen (—O), or the like. Termination by hydroxide (—OH) and/or oxygen (—O) can occur, for example, as a result of a cleaning or photoresist stripping process performed on the surface 112 of the substrate 110 and/or by exposing the surface 112 of the substrate 110 to a natural environment that contains oxygen. The terminating species TS can be other species, such as hydrogen (—H), nitrogen (—N), ammonia (—NH$_3$), or the like, such as depending on a cleaning and/or stripping process that is performed on the surface 112.

In some embodiments, the surface 112 of the substrate 110 initially carries the terminating species TS. That is, the substrate 110 includes terminating species TS itself. In some other embodiments, the surface 112 of the substrate 110 has high affinity to precursors A1 (see FIG. 1B), such that the precursors A1 will be adsorbed on the surface 112. In still some other embodiments, the surface 112 is initially neutral, and a surface treatment (e.g., the cleaning and/or stripping process mentioned above) can be performed on the surface 112 to change or modify the surface termination.

Then, a bottom dielectric film 122 (see FIG. 1C) is formed over the substrate 110. The bottom dielectric film 122 is formed using a deposition technique that can form a monolayer, such as atomic layer deposition (ALD). ALD is an approach to filling dielectrics that involves depositing a monolayer of precursor over the substrate 110, purging the chamber, and introducing a reactant that reacts with the precursor to leave a monolayer of product. The cycle can be repeated many times to build a layer with a sufficient thickness to be functional. In FIG. 1C, the bottom dielectric film 122 can be a monolayer (i.e., one cycle is performed) or multilayers (i.e., multiple cycles are performed).

Figure 1B:
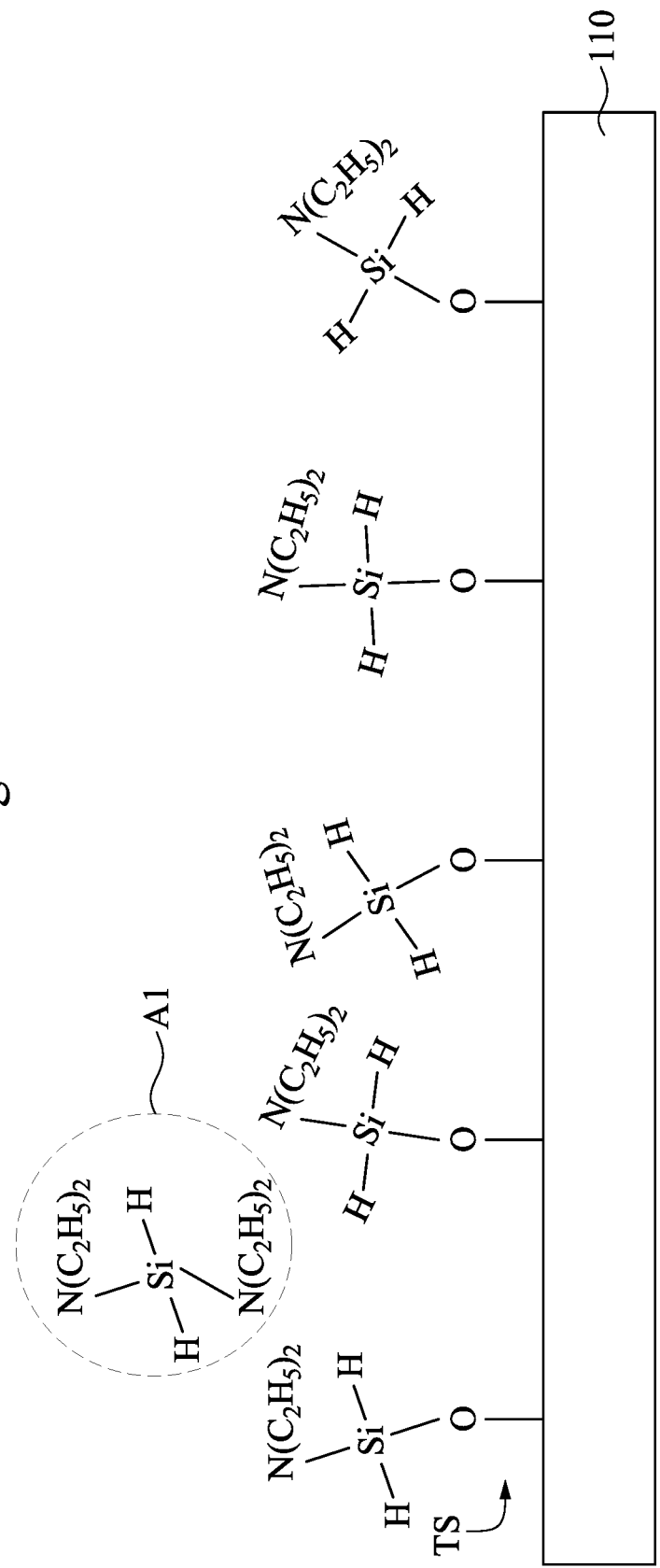
Figure 1C:
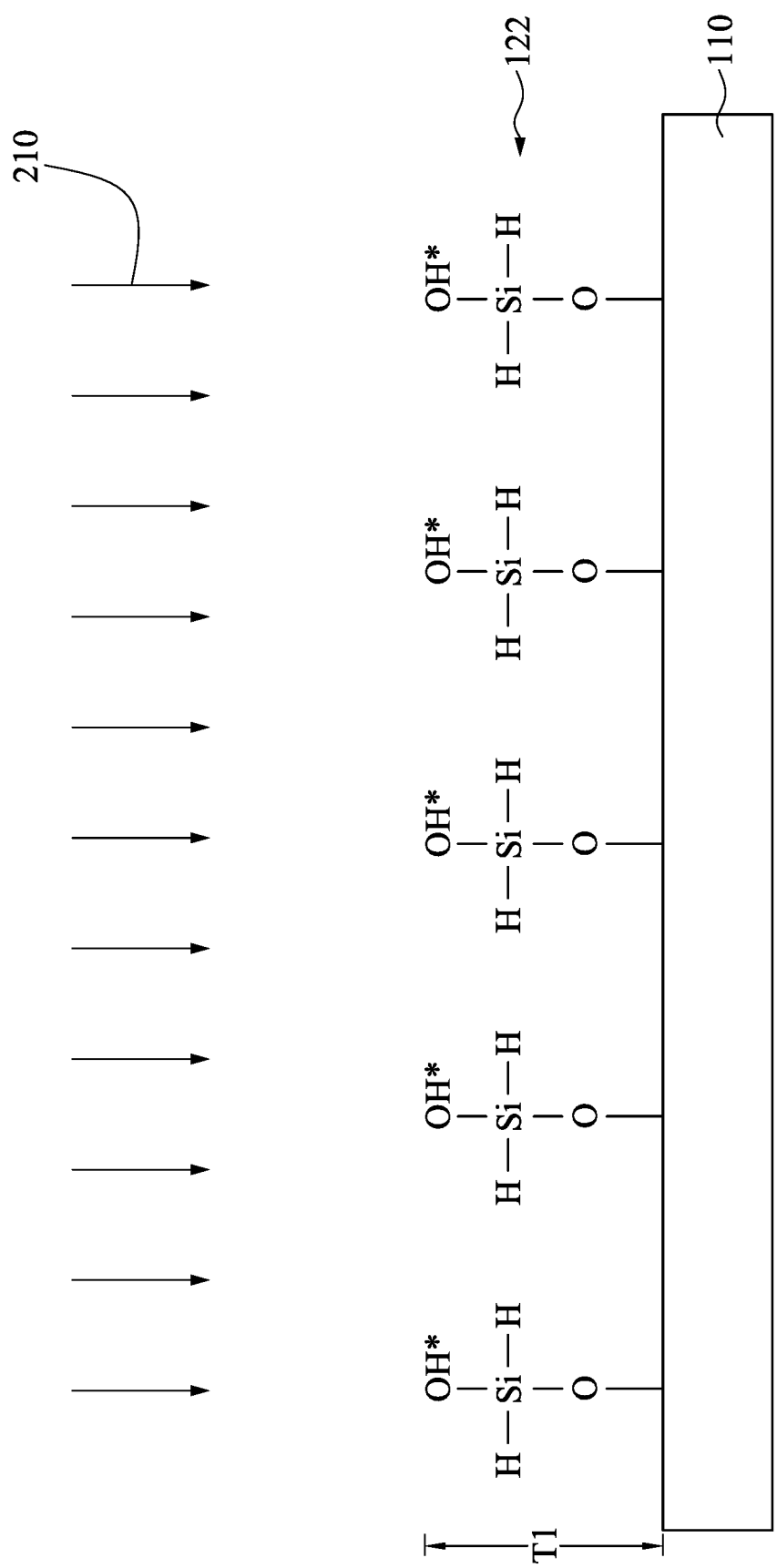

Reference is made to FIG. 1B. During the ALD process, the substrate 110 is positioned on a chuck in an ALD process chamber. A vacuum is then applied to the ALD process chamber to remove oxygen and moisture and the temperature is raised to an acceptable level that is suitable for the ALD deposition. Precursors A1 including a reactive compound such as Si surrounded by organic ligands or other suitable substituents, e.g. $-N(C_2H_5)_2$, $-OCH_3$, $-H$, or the like, are then fed into the ALD process chamber. This causes a chemical reaction in which a substituent is removed from the precursors A1 and replaced with a bond between the reactive compound (e.g., Si atom) in the precursors A1 and the terminating species TS (e.g., hydroxyl group) of the surface 112 of the substrate 110. Such a reaction may change the oxidation state of the element of the precursors A1. The reaction may be driven by the fact that the Si-ligand bond is a relatively weak bond, with Si having a higher affinity for binding to an oxygen atom, such that the overall Gibbs free energy ($\Delta G$) of the reaction is negative. The effective coverage of the surface 112 with the precursors A1 depends on a number of factors, such as ligand size and duration of the exposure of the surface 112. In some embodiments, the precursor A1 may be $C_8H_{22}N_2Si$, Methyldiethoxysilane (Di Ethoxy Methyl Silane), or other suitable materials.

Reference is made to FIG. 1C. Then, residual precursors A1 (see FIG. 1B) are discharged from the reaction chamber for a period of time. To more effectively discharge the residual precursors A1 from the ALD process chamber, purge gas may be injected into the ALD process chamber during this purging period, wherein the purge gas may include a substantially inert gas such as $N_2$, Ar, He, or similar inert gases.

Then, a decomposition process 210 of the precursors A1 is performed. For example, the substrate 110 may be exposed to an oxide source, e.g. $H_2O$, $O_3$, plasma-generated oxygen radicals (which is a plasma treatment) or another suitable oxygen source, which replaces the remaining substituents of the precursors A1 with oxygen, thereby forming the bottom dielectric film 122 over the surface 112. In some other embodiments, the substrate 110 may be exposed to a nitrogen source (such as $NH_3$), a carbon source, or other suitable sources to form the bottom dielectric film 122. In some embodiments, the bottom dielectric film 122 has a thickness T1.

In some other embodiments, the decomposition process 210 may be a thermal process. That is, the substrate 110 is heated to a suitable temperature such that the precursors A1 are decomposed without providing oxygen or other sources or performing a plasma process. Specifically, when the temperature of the precursors A1 reaches their decomposition temperatures, the precursors A1 break down and the reactive compound (e.g., Si atoms) are free to deposit on the heated substrate 110. If the substrate 110 is maintained at a sufficiently high temperature, the bottom dielectric film 122 deposition proceeds.

Figure 1D:
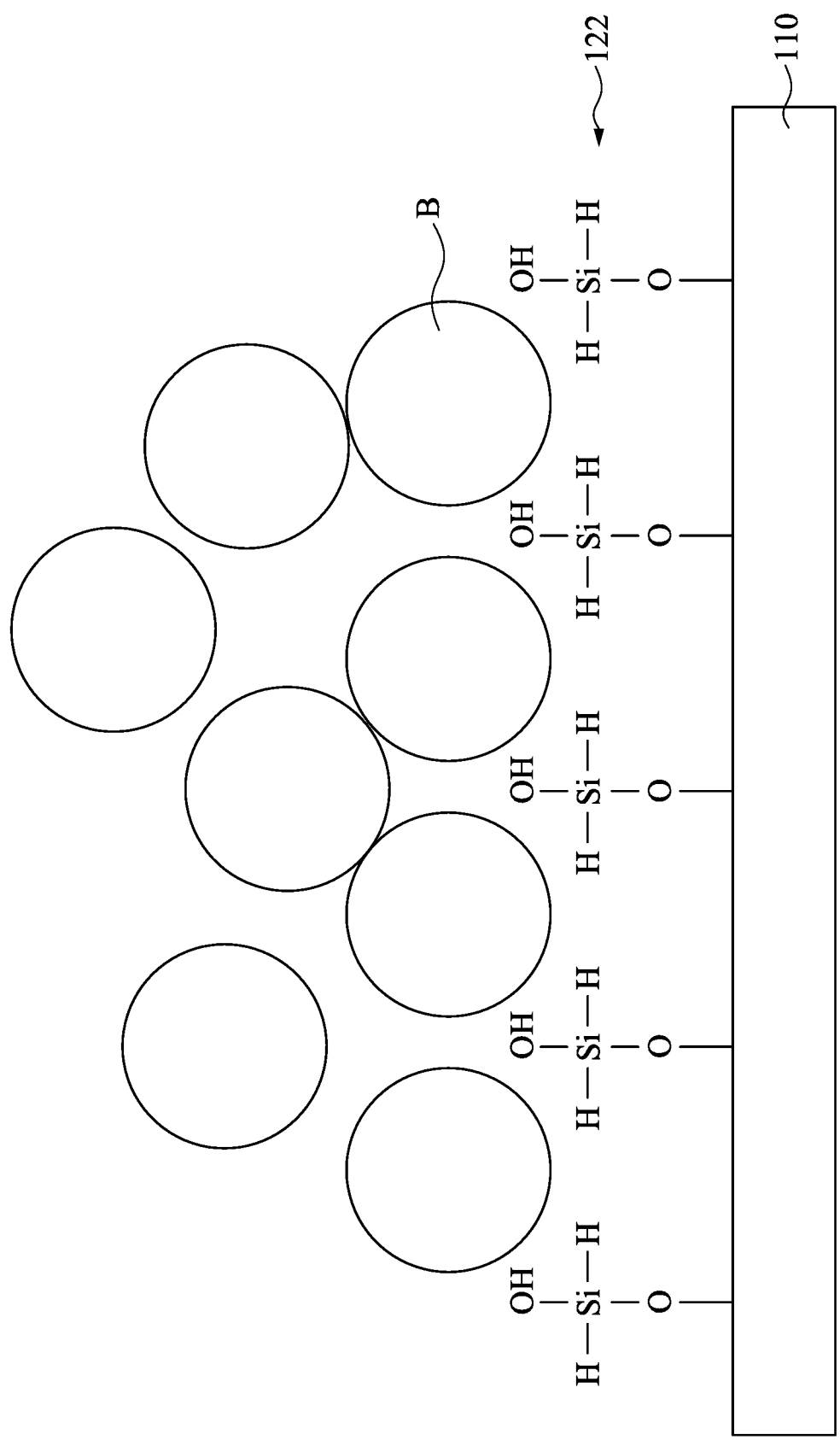

Reference is made to FIG. 1D. Plural porogens B are formed over the bottom dielectric film 122. The porogens B may be a molecule that can be removed from the dielectric films 122 and 124 (see FIG. 1G) after the dielectric films 122 and 124 have set in order to form pores therebetween and thereby reduce the overall value of the dielectric constant of the dielectric layer 120 (see FIG. 1G). The porogens B may be a material that is big enough to form the pores while also remaining small enough such that the size of the individual pores does not overly displace the dielectric films 122 and 124. As such, the porogens B may include an organic molecule that includes one or more ring structures within the individual molecules of the porogens B. Additionally, in order to reduce the size of the individual pores, the individual molecules of the porogens B may have a small ring or small mass. By using a ring structure and having a small mass, the size of the individual pores that will be formed once the porogens B are removed may be tailored to decrease the dielectric constant of the dielectric layer 120.

In some embodiments the porogens B may be a cyclic, non-aromatic, small mass, and single bonded molecule such as cyclooctane, which has a non-aromatic ring structure with eight carbon atoms and has single bonds throughout the ring structure. However, any suitable molecule that has one or more ring structures, a large percentage of single bonds between the atoms, and a small mass, such as cycloheptane, cyclohexane, cyclodiene, may alternatively be utilized. Additionally, one or more functional groups, such as a methyl group ($-CH_3$), an ethyl group ($-C_2H_5$), an isopropyl group ($-C_3H_7$) or the like may be linked at the side of the ring structure. In some other embodiments, the porogens B may be alpha-Terpinene (ATRP), beta-Terpinene, gamma-Terpinene, or the like. These and all other suitable porogens as described herein are fully intended to be included within the scope of the embodiments.

The porogens B can be spread into a chamber in a pressure range of from about 1 mTorr to about 9000 mTorr. With this pressure range, the porogens B can be in monomer forms to minimize the sizes thereof. If the pressure is out of this range, the porogens B may be adsorbed together to form droplets, and the size of the porogens B are increased. Also, the sizes of pores 130 (see FIG. 1H) are increased. The porogens B may be adsorbed on the bottom dielectric film 122 with Van der Waals force or be bond to the bottom dielectric film 122, depending on the material of the porogens B. For example, if the porogens B include hydrogen bonds, the hydrogen of the porogens B can bond to hydroxide ($-OH$) of the bottom dielectric film 122 to form $H_2O$, which will be released from the porogens B and the bottom dielectric film 122. Hence, the porogens B are bond to the bottom dielectric film 122.

In some embodiments, the deposition of the porogens B and the formation of the bottom dielectric film 122 can be performed in different chambers. This configuration prevents excess porogens B pollute the ALD chamber if the porogens B are adhesive. In some other embodiments, however, the deposition of the porogens B and the formation of the bottom dielectric film 122 can be performed in the same chamber, i.e., the ALD chamber.

Figure 1E:
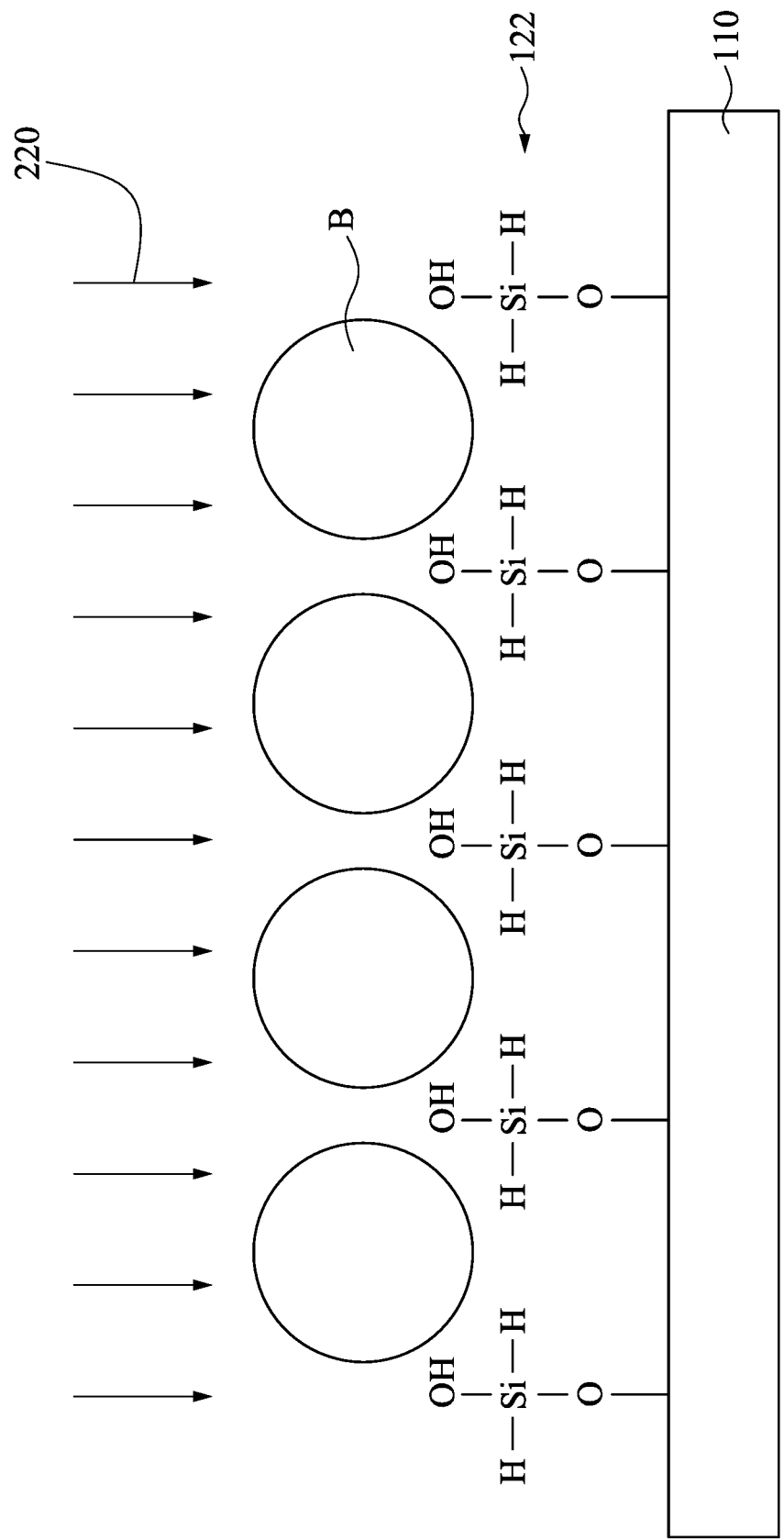

Reference is made to FIG. 1E. The excess porogens B (which are not adsorbed on the bottom dielectric film 122) are removed out of the chamber. For example, a thermal treatment 220 is performed on the porogens B to vapor the excess porogens B. Specifically, an affinity between the porogen B and the bottom dielectric film 122 is stronger than an affinity between the porogens B. As such, when the thermal treatment 220 is performed on the porogens B, a portion of the porogens B which are not adsorbed on the bottom dielectric film 122 are released and then vapor, and another portion of the porogens B which are adsorbed on the bottom dielectric film 122 remain on the bottom dielectric film 122. The thermal treatment 220 can be a plasma treatment, a heating process, an irradiating treatment, or other suitable treatments. Furthermore, the removal of the excess porogens B may be the thermal treatment 220 with a purging process to purging out the excess porogens B. In some other embodiments, the density of the porogens B can be modified by tuning the concentration of the porogens B, the pressure and the temperature of the chamber, the purging time, or other parameters. With such configuration, the remaining porogens B are mostly monomers.

Figure 1F:
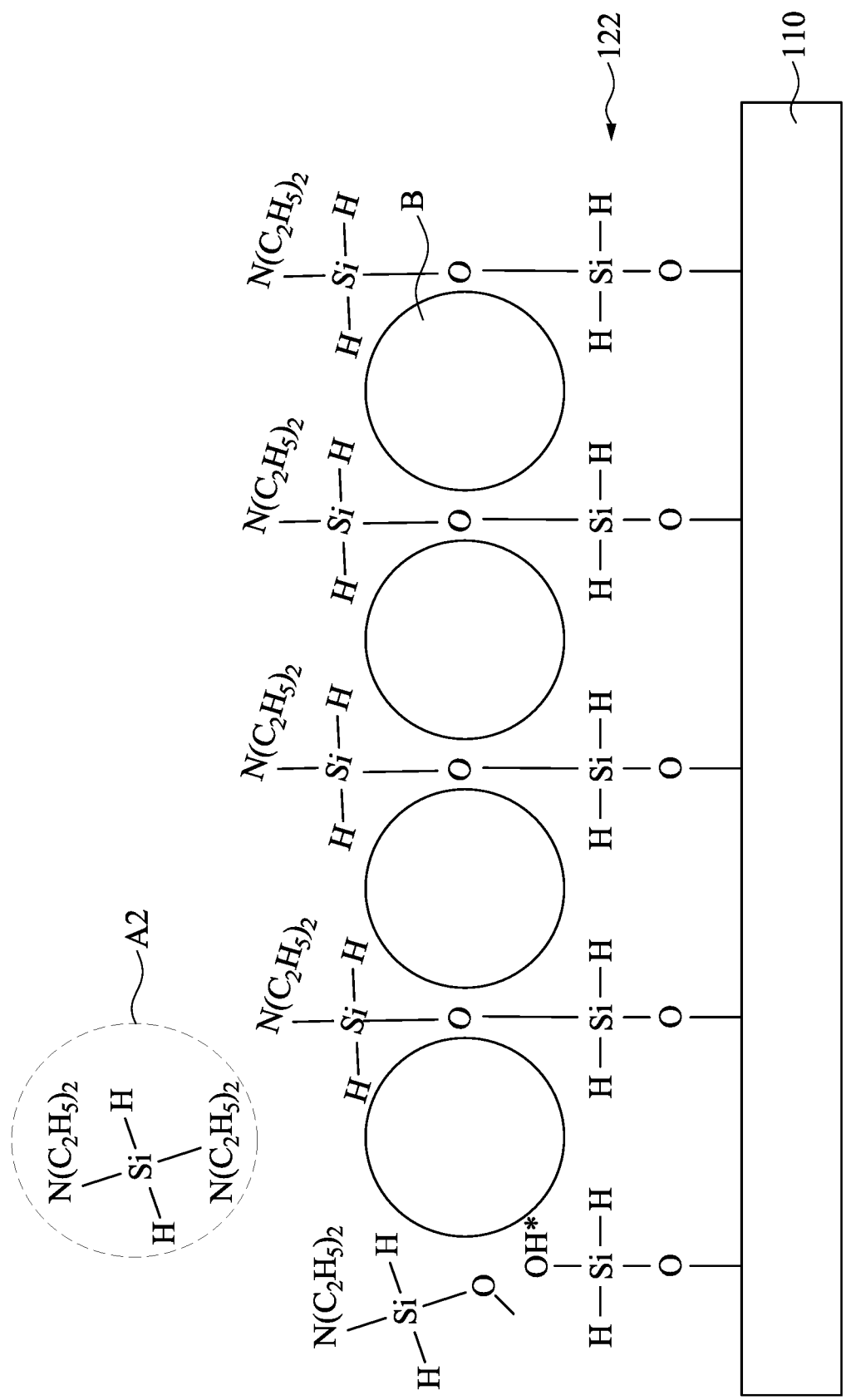

Reference is made to FIG. 1F. Then, a dielectric film 124 (see FIG. 1G) is formed over the bottom dielectric film 122 and the porogens B. The dielectric film 124 is formed using a deposition technique that can form a monolayer, such as ALD. Precursors A2 including a reactive compound such as Si surrounded by organic ligands or other suitable substituents, e.g. —N($C_2H_5$)$_2$, —OCH$_3$, —H, or the like, are then fed into the ALD process chamber. This causes a chemical reaction in which a substituent is removed from the precursors A2 and replaced with a bond between the reactive compound (e.g., Si atom) in the precursors A2 and the substituent (e.g., hydroxyl group) of the precursors A1 and/or the porogens B. In some embodiments, the precursor A2 may be $C_8H_{22}N_2Si$, Methyldiethoxysilane (Di Ethoxy Methyl Silane), or other suitable materials. In some embodiments, the precursor A1 and A2 are the same. In some other embodiments, the precursors A2 may have a material different from the precursors A1 to modify the mechanical strength of the dielectric layer 120 (see FIG. 1H).

In FIG. 1F, since the precursors A2 are small enough, the precursors A2 can be deposited between spaces among the porogens B, such that the porogens B are surrounded (or wrapped) by the precursors A2, i.e., the precursors A2 separate the porogens B. Hence, the number of the pores 130 (see FIG. 1H) is substantially the same as the molecule number of the porogens B. Furthermore, the precursors A2 can be bond to the bottom dielectric film 122 through the spaces to increase the mechanical strength of the formed dielectric layer 120 (see FIG. 1H).

Figure 1G:
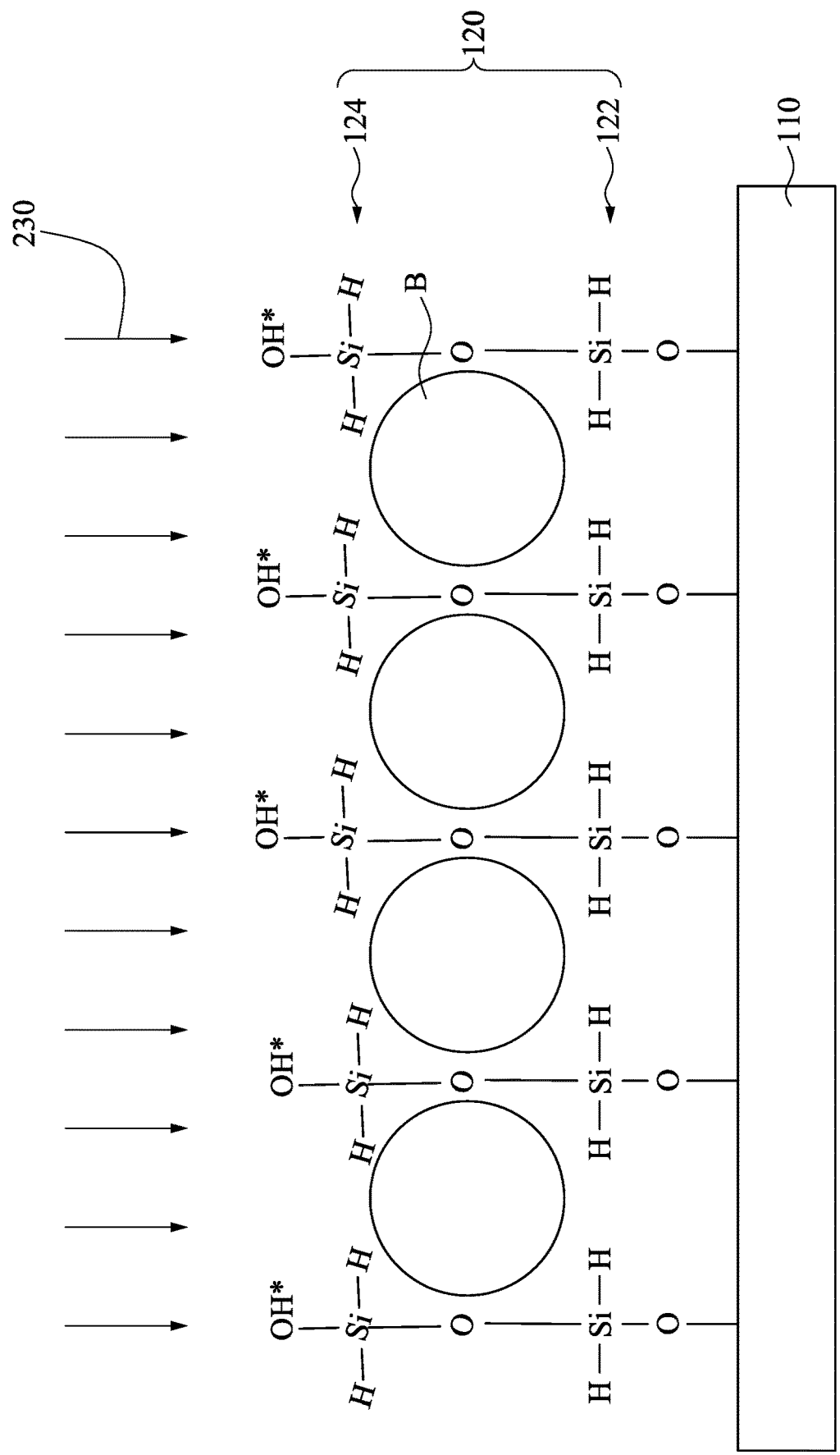

Reference is made to FIG. 1G. The residual precursors A2 are purged out of the chamber. Then, a decomposition process 230 is performed. For example, the substrate 110 may be exposed to an oxide source, e.g. $H_2O$, $O_3$, plasma-generated oxygen radicals or another suitable oxygen source (which is a plasma treatment), which replaces the remaining substituents of the precursors A2 with oxygen, thereby forming the dielectric film 124 over the bottom dielectric film 122 and the porogens B. In some other embodiments, the substrate 110 may be exposed to a nitrogen source (such as $NH_3$), a carbon source, or other suitable sources to form the dielectric film 124. In some other embodiments, the decomposition process 230 may be a thermal process. That is, the substrate 110 is heated to a suitable temperature (e.g., lower than a processing temperature for the plasma treatment, such as in a range of about 0° C. to about 500° C.) such that the precursors A2 are decomposed without providing oxygen or other sources or performing a plasma process.

Figure 1H:
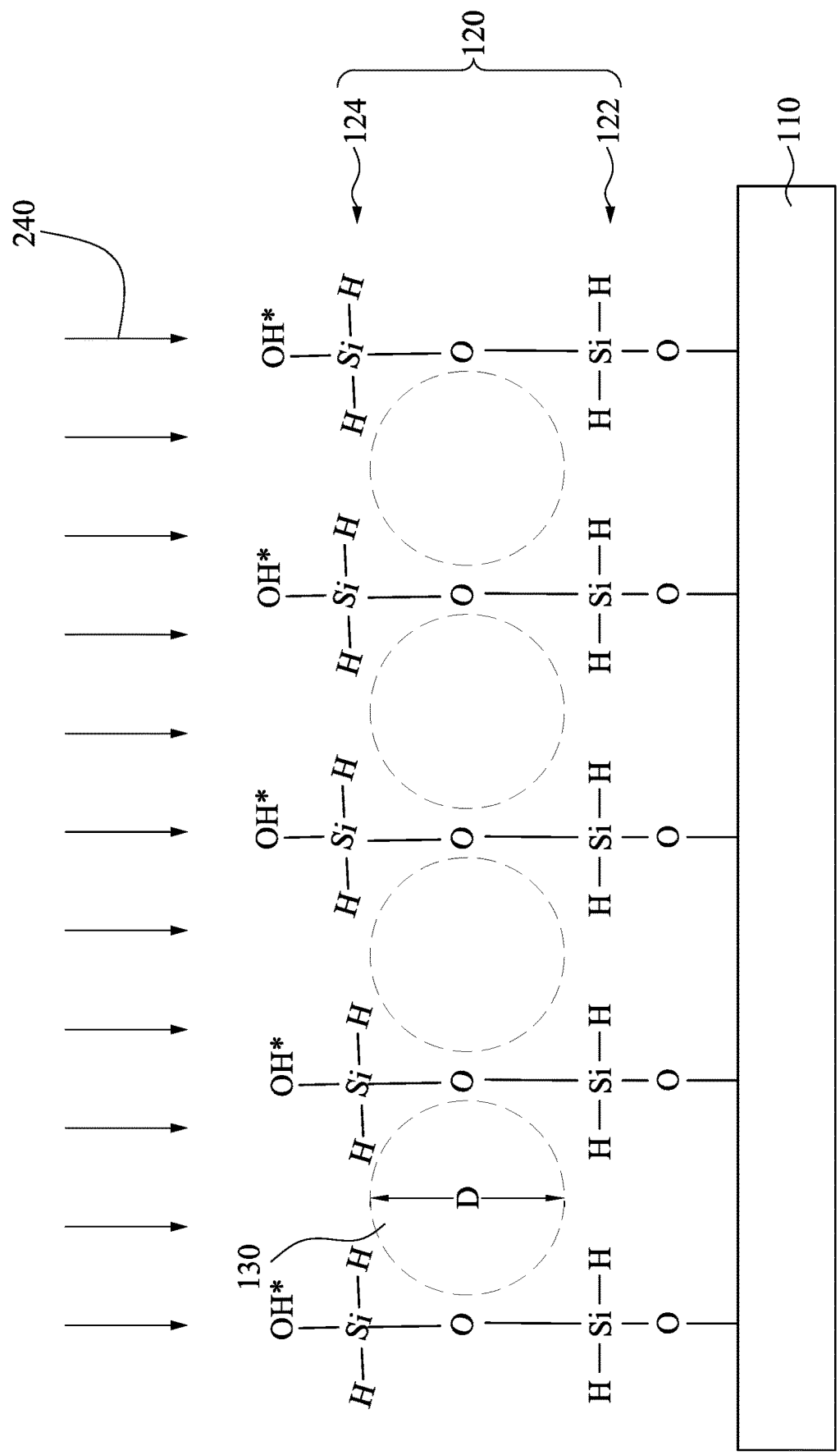

Reference is made to FIG. 1H. The porogens B (see FIG. 1G) are removed to form a plurality of pores 130 between the dielectric films 122 and 124. The removal process 240 of the porogens B may be performed by a thermal process which can break down and vaporize the porogens B, thereby allowing the porogens B to diffuse and leave the dielectric films 122 and 124, thereby leaving behind a structurally intact porous dielectric material as the dielectric layer 120. Since the dielectric film 124 is thin enough (e.g., monolayer or a few atomic layers), the porogens B can be effectively removed. That is, the dielectric film 124 prevents the porogens B from remaining under the dielectric film 124.

However, as one of ordinary skill in the art will recognize, the removal process 240 described above is not the only method that may be utilized to remove the porogens B from the dielectric films 122 and 124 to form the dielectric layer 120. Other suitable processes, such as irradiating the porogens B with UV radiation to decompose the porogens B, or utilizing microwaves or e-beam to decompose the porogens B, may alternatively be utilized. These and any other suitable process to remove all or a portion of the porogens B are all intended to be included within the scope of the embodiments.

Some other embodiments the removal process 240 includes an UV treatment using a UV source to irradiate the porogens B with UV radiation. The UV source may include a broad beam (BB) UV source. Embodiments may further include using a monochronomator, diffraction grating, or, a filter to selectively remove undesired wavelengths from the UV radiation. The UV treatment decomposes the porogens B, thereby forming the pores 130 in the dielectric layer 120.

The dielectric constant of the dielectric layer 120 is a combination of the dielectric constant of air (the pores 130) and the dielectric constant of the dielectric films 122 and 124. After the pore generation, the dielectric constant of the dielectric layer 120 may be below about 2.4, e.g., about 1.8 to about 2.4. With such dielectric constant, the RC time constant of a device can be reduced and the device performance can be improved. The dielectric layer 120, which may also be referred to as an inter-level dielectric (ILD) layer in some embodiments, may include oxide based dielectric, such as ceramic. For example, the dielectric layer 120 in FIG. 1H includes silicon oxide. In some other embodiments, the dielectric layer 120 may include nitride, carbon, organic polymers, or other suitable dielectric materials, depending on the materials of the precursors (such as the precursors A1 and A2 in FIGS. 1B and 1F).

The dielectric layer 120 has a pore size D of from about 3 nm to about 10 nm and a volume percentage porosity of from about 10% to about 75%. As mentioned above, since the porogens B are almost in monomer forms, the pore sizes D are substantially uniform.

In FIG. 1H, the dielectric layer 120 is formed by repeatedly performing monolayer/multilayer deposition, deposition of porogens, performing another monolayer/multilayer deposition, and then removal of the porogens. The monolayer/multilayer can be formed by performing ALD process. The ALD layer, i.e., the dielectric film 122, is easy to be adhered to the surface 112 of the substrate 110, so that the dielectric layer 120 has good adhesion with the surface 112. Moreover, since the dielectric films 122 and 124 are ALD layers, the dielectric layer 120 has small thickness to reduce the whole size of the device. Also, the thin dielectric films 122 and 124 also lower the density of the dielectric layer 120 to lower the dielectric constant thereof. Furthermore, since the porogens B are mostly monomers, the dielectric layer 120 has uniform pore sizes. In addition, the precursors are small enough to be disposed between the spaces among the porogens B, so that the dielectric film 124 can wrap the individual porogens B and is in contact with the underlying dielectric film 122. With such a configuration, the dielectric layer 120 has good mechanical strength. Moreover, the material of the dielectric layer 120, such as oxide (ceramic), also improves the mechanical strength thereof. The mechanical strength of the dielectric layer 120 can also be tuned by determining the ALD cycles and/or the material of each of the dielectric films 122 and 124. Furthermore, the porogens B are removed right after the formation of the dielectric film 124, the porogens B can be efficiently removed (or vaporized) since the dielectric film 124 has small thickness.

Figure 2A:
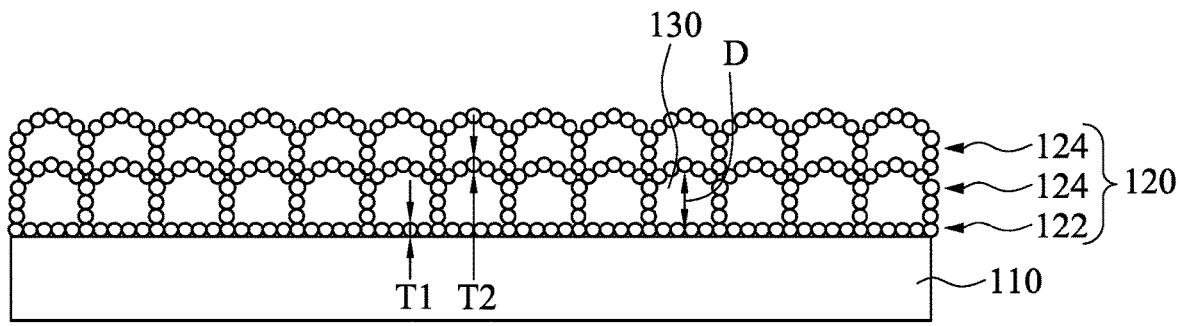
FIGS. 2A to 2E are cross-sectional views of super low-k dielectric layers 120 in accordance with some embodiments of the present disclosure.
Figure 2B:
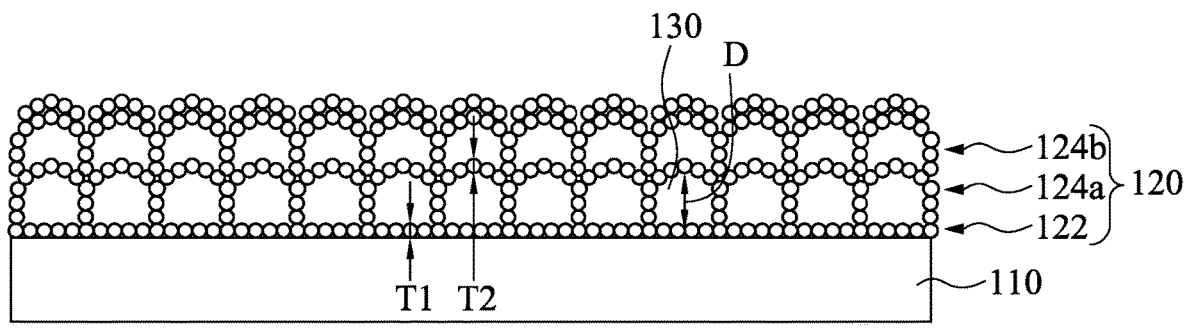
Figure 2C:
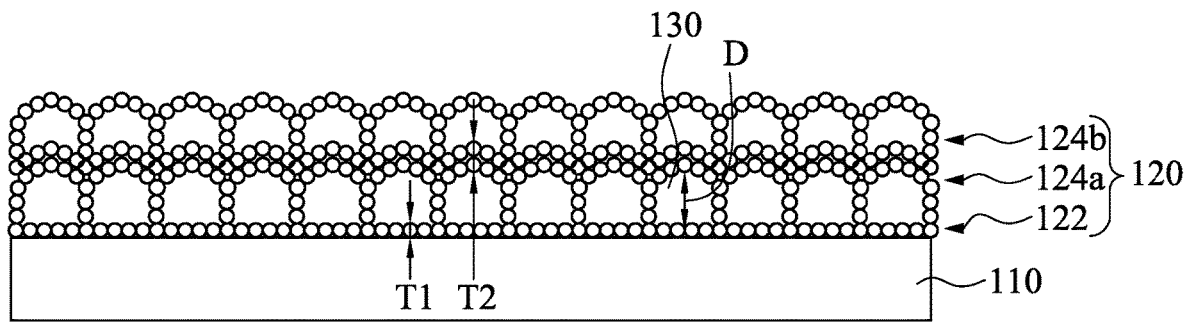
Figure 2D:
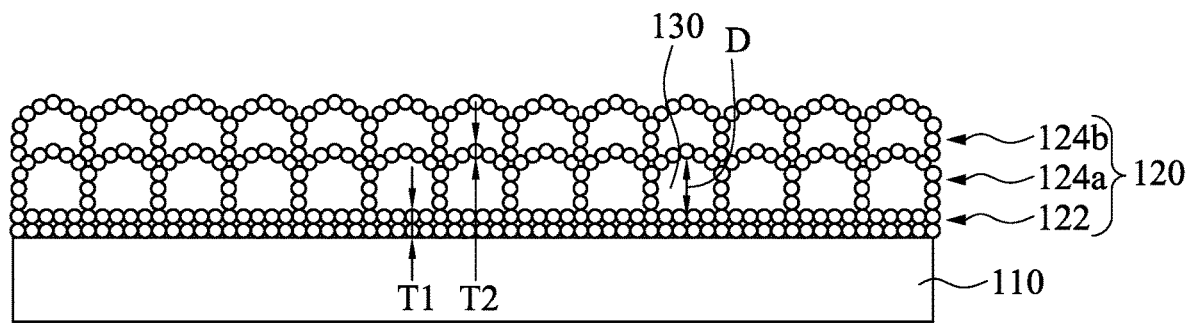
Figure 2E:
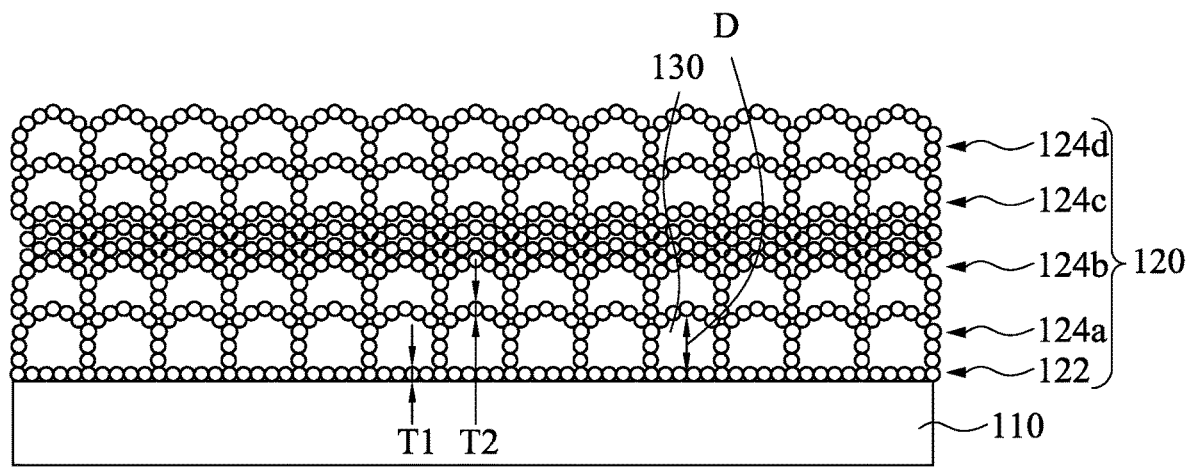

In some embodiments, the processes of FIGS. 1D to 1H can be repeatedly performed to form a plurality of dielectric films 124 over the structure of FIG. 1H to form a super low-k dielectric layer 120 over the substrate 110. FIGS. 2A to 2E are cross-sectional views of super low-k dielectric layers 120 in accordance with some embodiments of the present disclosure. It is noted that the circles in FIGS. 2A to 2E represent reacted precursors (such as the reacted precursors shown in FIG. 1C) of the dielectric films 122 and 124, and the sizes of the pores 130 and the reacted precursors shown in FIGS. 2A to 2E are illustrated only, and do not limit the scope of the embodiments. In FIG. 2A, the dielectric layer 120 includes the dielectric film 122 and two dielectric films 124. The dielectric films 122 and 124 respectively are monolayers. In FIG. 2B, the dielectric layer 120 includes dielectric films 122, 124a, and 124b. The dielectric films 122 and 124a respectively are monolayers, and the dielectric film 124b is multilayer. In FIG. 2C, the dielectric films 122 and 124b respectively are monolayers, and the dielectric film 124a is multilayer. In FIG. 2D, the dielectric films 124a and 124b respectively are monolayers, and the dielectric film 122 is multilayer. In FIG. 2E, the dielectric layer 120 includes the dielectric film 122, 124a, 124b, 124c, and 124d. The dielectric films 122, 124a, 124c, and 124d are monolayer, and the dielectric film 124b is multilayer.

In FIGS. 2A to 2E, the pores 130 have similar sizes. The bottom dielectric film 122 has a thickness T1, and the pore 130 has a pore size D (such as a diameter of the pore 130). In some embodiments, the thickness T1 of the bottom dielectric film 122 is smaller than the pore size D of the pore 130. The dielectric film 124 (, 124a, 124b) has a thickness T2, and in some embodiments the thickness T2 of the dielectric film 124 (124a, 124b) is smaller than the pore size D of the pore 130.

In some embodiments, the dielectric layer 120 may be about 3 nm to about 10 nm thick. With such configuration, the dielectric layer 120 has small thickness, low-k, and good mechanical strength. It is noted that the dielectric layers 120 shown in FIGS. 2A to 2E are illustrated, and do not limit the scope of the embodiments. In some other embodiments, the dielectric layer 120 may include plural dielectric films 124, and each of the dielectric films 122 and 124 can be mono-layer or multilayers.

The present disclosure will now be described with respect to some embodiments in a specific context, namely the creation of a super low-k ILD and copper conductive lines in the damascene process. It is believed that embodiments described herein will benefit other integrated circuit porogen applications not specifically mentioned. Therefore, the specific embodiments discussed are merely illustrative of specific ways to make and use the disclosure, and do not limit the scope of the disclosure.

Figure 3A:
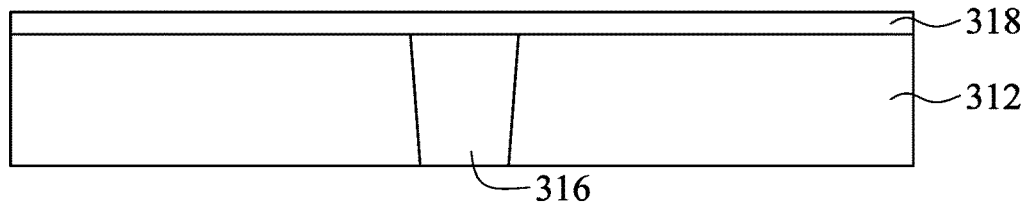
FIGS. 3A to 3G are cross-sectional views of a method for manufacturing an interconnect structure at various stages in accordance with some embodiments of the present disclosure.

FIGS. 3A to 3G are cross-sectional views of a method for manufacturing an interconnect structure at various stages in accordance with some embodiments of the present disclosure. Reference is made to FIG. 3A. A wafer 310 is provided. The wafer 310 includes a first dielectric film 312 formed thereon is shown. The wafer 310 may include a substrate (not explicitly shown) underlying the first dielectric film 312, and may include, for example, bulk silicon, doped or undoped, or an active layer of a semiconductor-on-insulator (SOI) substrate. In some embodiments, an SOI substrate includes a layer of a semiconductor material, such as silicon, formed on an insulator layer. The insulator layer may be, for example, a buried oxide (BOX) layer or a silicon oxide layer. The insulator layer is provided on a substrate and may be a silicon or glass substrate. Other substrates, such as a multi-layered or gradient substrate may also be used.

In some embodiments, electrical circuitry is formed on the substrate and may be some types of circuitry suitable for a particular application. In some embodiments, the electrical circuitry includes electrical devices formed on the substrate with one or more dielectric films overlying the electrical devices. Metal layers may be formed between overlying dielectric films, such as those discussed herein, to route electrical signals between the electrical devices. Electrical devices may also be formed in one or more dielectric films.

For example, the electrical circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

The first dielectric film 312 may be formed, for example, of a low-k dielectric material (materials having a dielectric constant lower than silicon dioxide), such as silicon oxynitride, phosphosilicate glass (PSG), borophosphosilicate glass (BPSG), fluorinated silicate glass (FSG), SiOxCy, SiOxCyHz, Spin-On-Glass, Spin-On-Polymers, silicon carbon material, compounds thereof, composites thereof, combinations thereof, or the like, by suitable methods, such as spinning, chemical vapor deposition (CVD), and plasma-enhanced CVD (PECVD). Other materials, such as super low-k materials (e.g., having a dielectric constant less than about 2.9), may also be used. These materials and processes are provided as examples and other materials and processes may be used.

At least one filling material 316 is formed in the first dielectric film 312. The filling material 316 may be formed by, for example, creating openings in the first dielectric film 312 using photolithography techniques. In some embodiments, photolithography techniques involve applying a photoresist material (not shown) and exposing the photoresist material in accordance with a desired pattern. The photoresist material is then developed to remove a portion of the photoresist material, thereby exposing the underlying material in accordance with the desired pattern. The remaining photoresist material protects the underlying material from subsequent processing operations, such as etching, performed to form the opening in which the filling material 316 is to be formed in the first dielectric film 312. The etching process may be a wet or dry, anisotropic or isotropic, etch process, such as an anisotropic dry etch process. After the opening is formed in the first dielectric film 312, a conductive material may be deposited to fill the openings. The filling material 316 may include metals, elemental metals, transition metals, or the like, such as a copper interconnect.

Optionally, over the first dielectric film 312 and the filling material 316 is a barrier layer or an etch stop layer (ESL) 318 in accordance with some embodiments. In some embodiments, the etch stop layers provide a mechanism to stop an etching process when forming vias and/or contacts. The barrier layer 318 is formed of a dielectric material having a different etch selectivity from adjacent layers, e.g., the underlying first dielectric film 312 or the substrate. In some embodiments, the barrier layer 318 may be formed of SiNx, SiCN, $SiO_2$, CN, AlOxNy, combinations thereof, or the like, deposited by CVD or PECVD techniques.

Figure 3B:
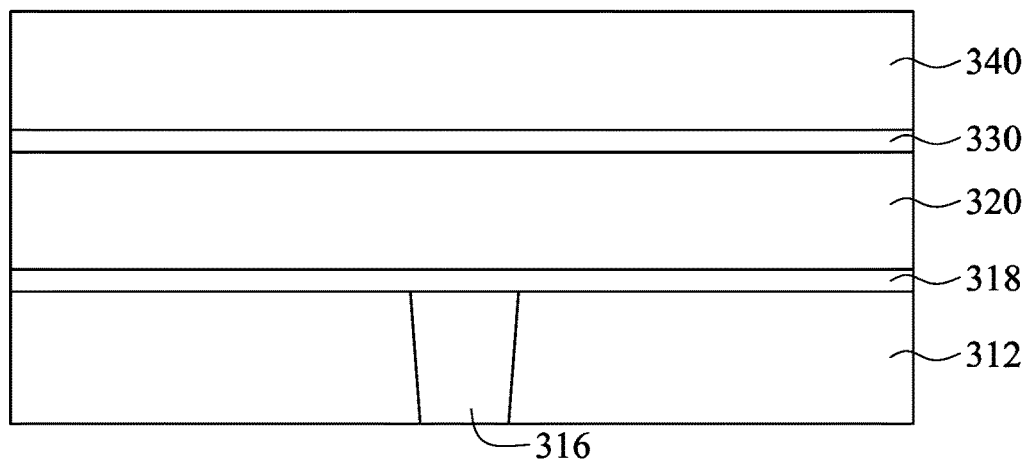

Reference is made to FIG. 3B. Over the wafer 310 (including the first dielectric film 312, the filling material 316, and the ESL 318 in this case) is a super low-k dielectric layer 320 in accordance with some embodiments. Since the formation of the super low-k dielectric layer 320 is similar to that of the dielectric layer 120 mentioned above, and thus a description thereof is omitted.

Then, a barrier layer 330 is formed over the super low-k dielectric layer 320. Since the formation of the barrier layer 330 is similar to that of the barrier layer 318 mentioned above, and thus a description thereof is omitted.

Then, another super low-k dielectric layer 340 is formed over the barrier layer 330. Since the formation of the super low-k dielectric layer 340 is similar to that of the dielectric layer 120 mentioned above, and thus a description thereof is omitted.

The super low-k dielectric layers 320 and 340 are layers that are to be subsequently patterned to, for example, form conductive lines and/or vias. For example, the super low-k dielectric layers 320 may be patterned to form vias extending to the filling material 316 and to the super low-k dielectric layers 340 may be patterned to form conductive lines to interconnect various electrical elements.

Although the super low-k dielectric layers 320 and/or 340 may be formed of similar materials using similar processes as those used to form the dielectric layer 120; different materials and processes may be used. Additionally, the super low-k dielectric layers 320 and/or 340 may be formed of the same or different material as that used to form the dielectric layer 120.

Figure 3C:
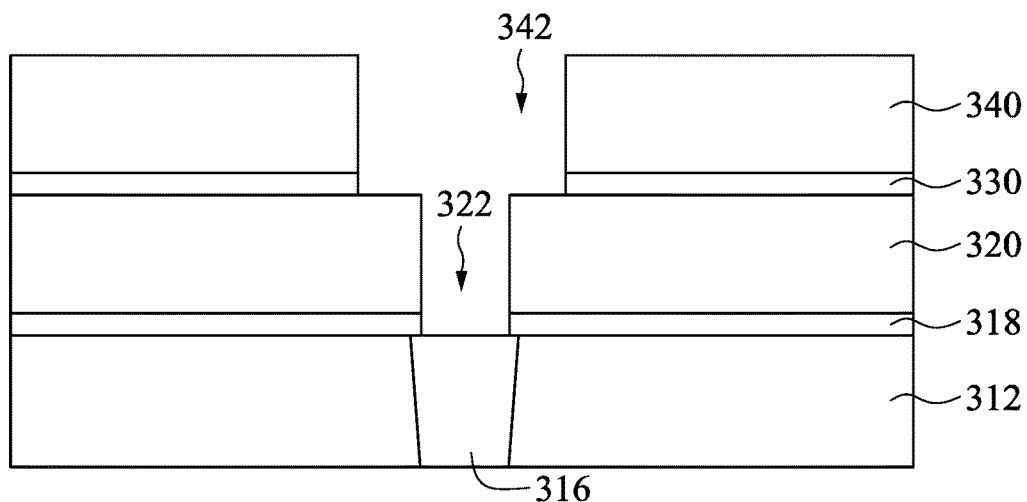

Reference is made to FIG. 3C. At least one opening 322 and at least one trench 342 are respectively formed in the super low-k dielectric layers 320 and 340. The trench 342 may interconnect plural openings 322 in some embodiments. The trench 342 pass through the super low-k dielectric layer 340 and the barrier layer 330 to expose the super low-k dielectric layer 320. The opening 322 pass through the super low-k dielectric layer 320 and the barrier layer 318 to expose the filling material 316. In some embodiments, the opening 322 and the trench 342 may be formed by performing multiple etching processes. The barrier layer 330 serves as the etch stop layer for etching the trench 342, and the barrier layer 318 serves as the etch stop layer for etching the opening 322.

Figure 3D:
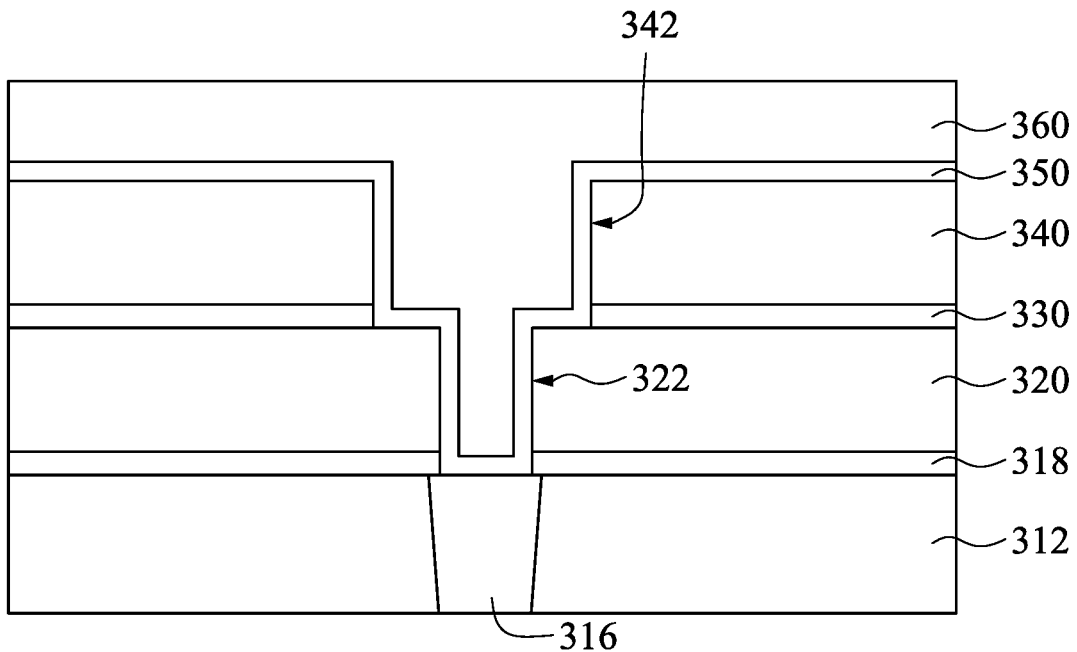

Reference is made to FIG. 3D. An adhesive layer 350 is conformally formed in the opening 322 and the trench 342. In some embodiments, the adhesive layer 350 is a metal layer including Ta, TaN, Co, Ru, Ti, TiN, or combinations thereof. The adhesive layer 350 may be formed using methods such as physical vapor deposition (PVD), sputtering, chemical vapor deposition (CVD), atomic layer deposition (ALD), and the like.

A conductive material 360 is formed on the adhesive layer 350 and fills in the opening 322 and the trench 342. The conductive material 360 at least includes metal element, e.g., copper (Cu). The conductive material 360 may include other suitable materials such as Ru, W, Ti, Al, Co, or combinations thereof.

Figure 3E:
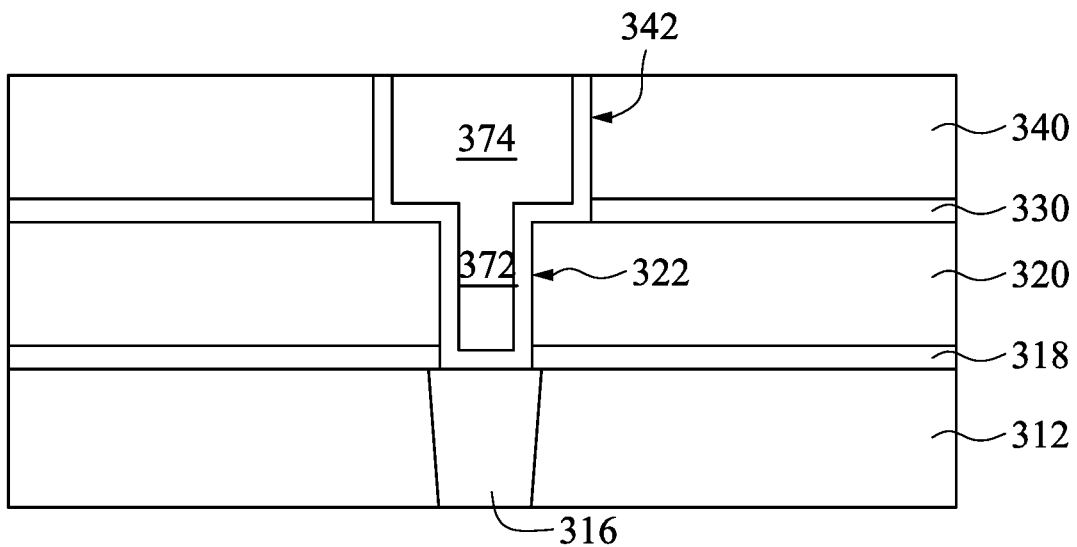

Reference is made to FIG. 3E. A planarization process, such as a chemical mechanical polishing (CMP) process, is performed after the formation of the conductive material 360 (see FIG. 3D) to remove the excess portions of the conductive material 360 and the adhesive layer 350 outside the trench 342, thus exposing the top surface of the super low k dielectric layer 340 and achieving a planarized surface. The portions of the conductive material 360 in the opening 322 are referred to as via 372, and the portion of the conductive material 360 in the trench 342 is referred to as a conductive line 374.

Figure 3F:
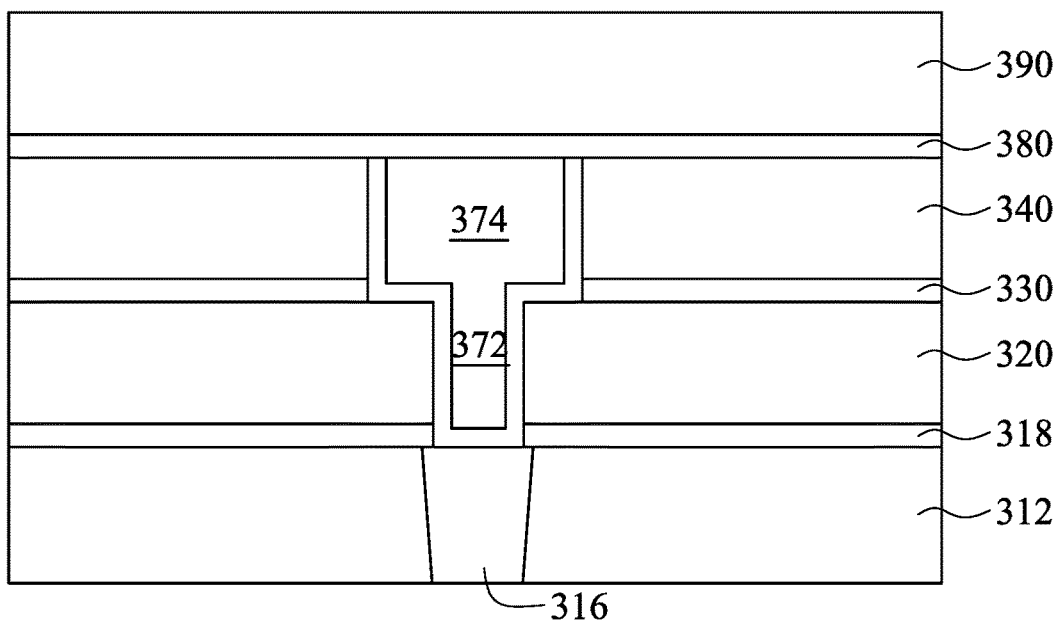

Reference is made to FIG. 3F. Another barrier layer 380 and another super low k dielectric layer 390 are sequentially formed over the structure of FIG. 3E. Since the formation of the barrier layer 380 and the super low-k dielectric layer 390 are similar to that of the barrier layer 318 and the dielectric layer 120 mentioned above, and thus a description thereof is omitted.

Figure 3G:
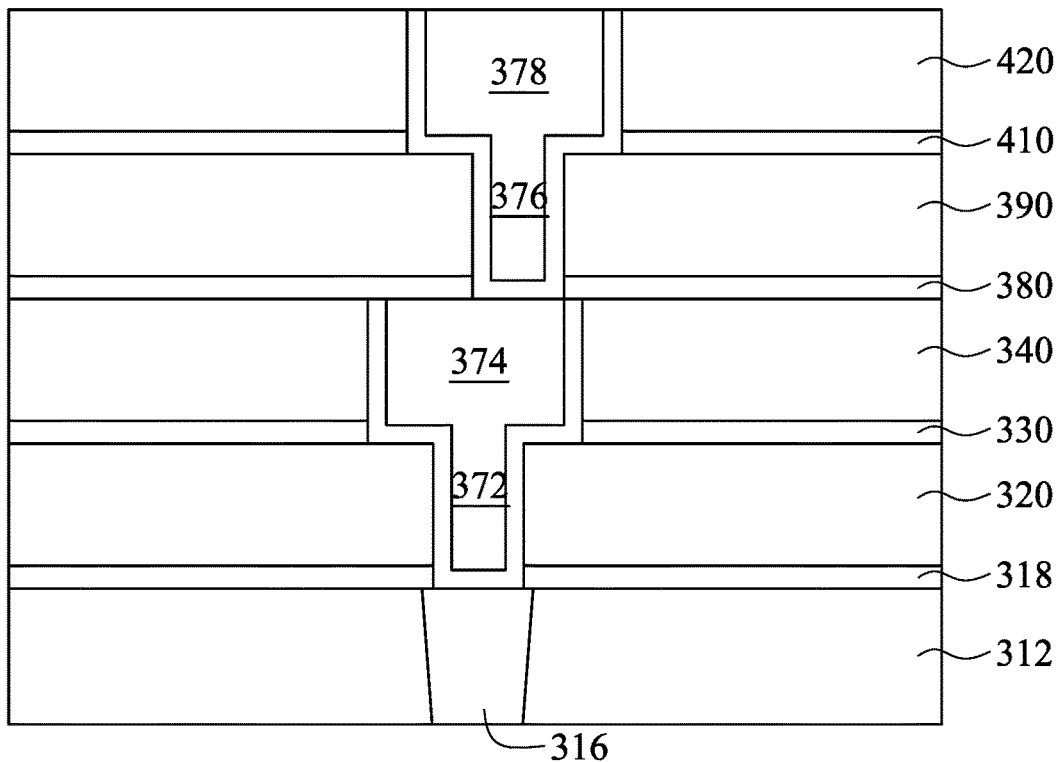

Reference is made to FIG. 3G. In some embodiments, the processes of FIGS. 3C to 3E can be repeatedly performed to form the via 376 and the conductive line 378.

According to some embodiments, the dielectric layer is formed by repeatedly performing monolayer/multilayer deposition, deposition of porogens, performing another monolayer/multilayer deposition, and then removal of the porogens. The monolayer/multilayer can be formed by performing ALD process. The ALD layer is easy to be adhered to many surfaces of materials, so that the dielectric layer has good adhesion with the surface. Moreover, since the dielectric films are ALD layers, the dielectric layer has small thickness to reduce the whole size of the device. Also, the thin dielectric films also lower the density of the dielectric layer to lower the dielectric constant thereof. Furthermore, since the porogens are mostly monomers, the dielectric layer has uniform pore sizes. In addition, the precursors are small enough to be disposed between the spaces among the porogens, so that the dielectric film can wrap the individual porogens and is in contact with the underlying dielectric film. With such a configuration, the dielectric layer has good mechanical strength. Moreover, the material of the dielectric layer, such as oxide (ceramic), also improves the mechanical strength thereof. The mechanical strength of the dielectric layer can also be tuned by determining the ALD cycles and/or the material of each of the dielectric films. Furthermore, the porogens are removed right after the formation of the dielectric film. The porogens can be efficiently removed (or vaporized) since the dielectric film has small thickness.

According to some embodiments, a method for manufacturing a dielectric layer includes forming a first dielectric film over a substrate. A first porogen is deposited over the first dielectric film. A second dielectric film is formed on and in contact with the first dielectric film and the first porogen. The first porogen is removed.

In some embodiments, the method further includes performing a thermal treatment on the first porogen before forming the second dielectric film.

In some embodiments, the method further includes performing a surface treatment on a surface of the substrate to form a terminating species on the surface of the substrate before forming the first dielectric film.

In some embodiments, the first and the second dielectric films have the same material.

In some embodiments, the first and the second dielectric films have different materials.

In some embodiments, the method further includes depositing a second porogen over the second dielectric film after removing the first porogen. A third dielectric film is formed on the second dielectric film and the second porogen. The second porogen is removed.

According to some embodiments, a method for manufacturing an interconnection structure includes depositing a first dielectric film over a substrate by a first atomic layer deposition process using first precursors. A porogen is deposited over the first dielectric film. A second dielectric film is deposited over the porogen and the first dielectric film by a second atomic layer deposition process using second precursors. The porogen is removed to form a dielectric layer including the first and second dielectric films. An opening is formed in the dielectric layer. A conductive material is formed in the opening.

In some embodiments, the first and second precursors have the same material.

In some embodiments, the first and second precursors have different materials.

In some embodiments, depositing the first dielectric film includes performing multiple cycles of the first atomic layer deposition process.

In some embodiments, depositing the second dielectric film includes performing multiple cycles of the second atomic layer deposition process.

In some embodiments, the method further includes performing a plasma treatment on the porogen before depositing the second dielectric film.

According to some embodiments, a dielectric layer includes a first dielectric film and a second dielectric film. The second dielectric film is on and in contact with the first dielectric film. A first pore is formed between the first dielectric film and the second dielectric film, and a thickness of the first dielectric film is smaller than a diameter of the first pore.

In some embodiments, a thickness of the second dielectric film is smaller than a diameter of the first pore.

In some embodiments, the first dielectric film is a monolayer.

In some embodiments, the second dielectric film is a monolayer.

In some embodiments, the dielectric layer further includes a third dielectric film on and in contact with the second dielectric film. A second pore is formed between the second dielectric film and the third dielectric film.

In some embodiments, the third dielectric film is a monolayer.

In some embodiments, the first and the second dielectric films have the same material.

In some embodiments, the first and the second dielectric films have different materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a dielectric layer, the method comprising:
   forming a first dielectric film over a substrate by using a first atomic layer deposition (ALD) process;
   depositing a first porogen over the first dielectric film;
   forming a second dielectric film on and in direct physical contact with the first dielectric film and the first porogen by using a second ALD process; and
   removing the first porogen.

2. The method of claim 1, further comprising performing a thermal treatment on the first porogen after forming the first dielectric film and before forming the second dielectric film.

3. The method of claim 1, further comprising performing a surface treatment on a surface of the substrate to form a terminating species on the surface of the substrate before forming the first dielectric film.

4. The method of claim 1, wherein the first and the second dielectric films have the same material.

5. The method of claim 1, wherein the first and the second dielectric films have different materials.

6. The method of claim 1, further comprising:
   depositing a second porogen over the second dielectric film after removing the first porogen;
   forming a third dielectric film on the second dielectric film and the second porogen; and
   removing the second porogen.

7. A method for manufacturing an interconnection structure, the method comprising:
   depositing a first dielectric film over a substrate by a first atomic layer deposition process using first precursors;
   depositing a porogen over the first dielectric film;
   after depositing the porogen, performing a plasma treatment on the porogen;
   depositing a second dielectric film over the porogen and the first dielectric film by a second atomic layer deposition process using second precursors, wherein performing the plasma treatment on the porogen occurs prior to depositing the second dielectric film over the porogen;
   removing the porogen to form a dielectric layer comprising the first and second dielectric films;
   forming an opening in the dielectric layer; and
   forming a conductive material in the opening.

8. The method of claim 7, wherein the first and second precursors have the same material.

9. The method of claim 7, wherein the first and second precursors have different materials.

10. The method of claim 7, wherein depositing the first dielectric film comprises performing multiple cycles of the first atomic layer deposition process.

11. The method of claim 7, wherein depositing the second dielectric film comprises performing multiple cycles of the second atomic layer deposition process.

12. A method for manufacturing an interconnection structure, the method comprising:
   performing a surface treatment on a substrate to form a terminating species on a surface of the substrate;
   performing, using a first silicon-containing material, a first atomic layer deposition (ALD) process on the substrate in a first process chamber, such that a substituent of the first silicon-containing material is replaced with the terminating species;

replacing a remaining substituent of the first silicon-containing material with a hydroxyl group;

depositing a porogen over the first silicon-containing material in a second process chamber different than the first process chamber;

performing, using a second silicon-containing material, a second ALD process on the porogen, such that a substituent of the second silicon-containing material is replaced with the hydroxyl group of the first silicon-containing material;

after performing the second ALD process, decomposing the porogen; and forming a conductive line extending through the first and second silicon-containing materials.

13. The method of claim 12, wherein replacing the remaining substituent of the first silicon-containing material is performed by a plasma treatment with an oxide source.

14. The method of claim 12, wherein decomposing the porogen is performed by a thermal process.

15. The method of claim 12, wherein decomposing the porogen is performed by irradiating the porogen with an UV radiation.

16. The method of claim 12, wherein the porogen comprises an organic molecule.

17. The method of claim 12, wherein the porogen comprises a single bonded molecule.

18. The method of claim 12, wherein the porogen comprises alpha-Terpinene (ATRP), beta-Terpinene, gamma-Terpinene, or combinations thereof.

19. The method of claim 12, wherein the porogen is in a monomer form.

20. The method of claim 12, further comprising:

performing a thermal treatment on the porogen after depositing the porogen and prior to performing the second ALD process on the porogen.

* * * * *